United States Patent [19]

Banaska

[11] Patent Number: 5,146,100
[45] Date of Patent: Sep. 8, 1992

[54] HIGH VOLTAGE SOLID-STATE SWITCH WITH CURRENT LIMIT

[75] Inventor: John G. Banaska, Brunswick, Ohio

[73] Assignee: Keithley Instruments, Inc., Cleveland, Ohio

[21] Appl. No.: 703,505

[22] Filed: May 21, 1991

[51] Int. Cl.[5] .............................................. G02B 27/00
[52] U.S. Cl. .................................... 250/551; 307/311
[58] Field of Search ................ 250/208.2, 551, 214 R; 307/311

[56] References Cited

U.S. PATENT DOCUMENTS

| | | |
|---|---|---|
| 4,408,131 | 10/1983 | Fox . |
| 4,423,330 | 12/1983 | El Mamamsy . |
| 4,682,061 | 7/1987 | Donovan . |
| 4,742,380 | 5/1988 | Chang et al. . |
| 4,745,311 | 5/1988 | Iwasaki . |
| 4,777,387 | 10/1988 | Collins . |
| 4,864,126 | 9/1989 | Walters . |
| 4,902,901 | 2/1990 | Pernyeszi . |
| 4,916,323 | 4/1990 | Hayashi et al. ..................... 250/551 |
| 4,939,375 | 7/1990 | Walters et al. . |

*Primary Examiner*—David C. Nelms
*Attorney, Agent, or Firm*—Pearne, Gordon, McCoy & Granger

[57] ABSTRACT

Two enhancement mode MOSFETs in series are used to provide a solid-state switch. The MOSFETs are turned on by a photovoltaic array. Resistors in series with the MOSFETs serve to provide a control voltage to current-limit the circuit. An additional photovoltaic array is used to supply drain to gate bias when the switch is off to minimize device capacitance. The circuits can be cascaded to raise the voltage-handling limits.

6 Claims, 1 Drawing Sheet

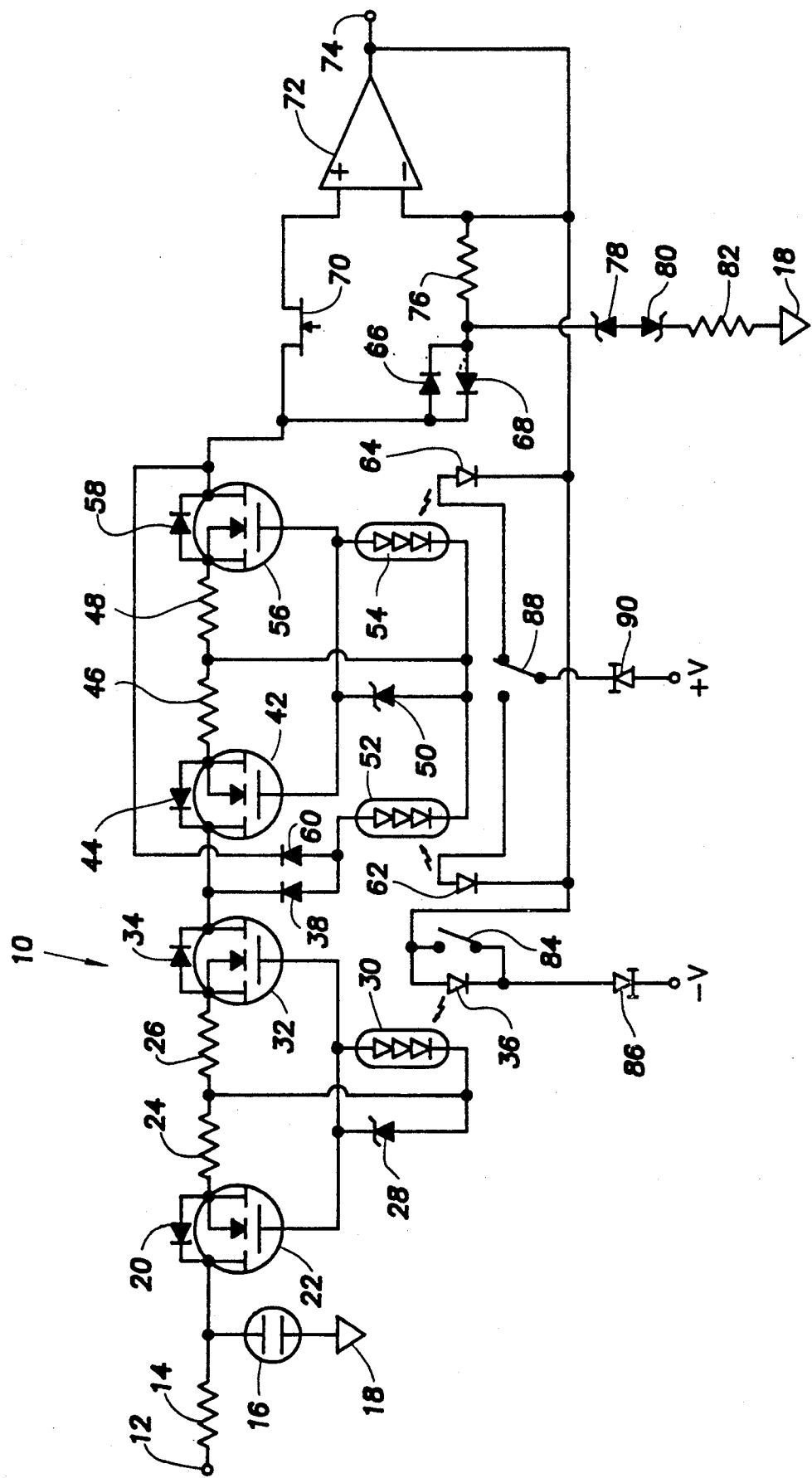

HIGH VOLTAGE SOLID-STATE SWITCH WITH CURRENT LIMIT

BACKGROUND OF THE INVENTION

The present invention relates to a solid-state switch, in particular, a switch to protect the input circuitry of a high-precision measurement device.

Description of the Prior Art

It is common in such devices as voltage and current measurement instruments to include a large protection resistor (e.g. 100–200 Kohms) in the input circuit to prevent large currents from flowing into the measurement circuitry. The Johnson noise associated with this protection resistor can result in a large noise level (e.g. 1 microvolt).

In addition, the input of these devices is often switched by relays. These relays must be able to switch high voltages (e.g. 1,000 volts) and large surge currents, and yet not introduce errors (e.g. thermal offsets and drift) in high-precision measurements. For example, a large, expensive, relay with a limited life is required to limit thermocouple effects to below 1 microvolt and still switch the required voltage and current.

SUMMARY OF THE INVENTION

The present invention provides excellent overload protection while greatly reducing the Johnson noise. In addition, the expense and bulk of input switching relays is avoided. The invention provides very low thermal offsets (e.g. <500 nanovolts) and very low thermal drift.

The current-limiting solid-state switch of the invention includes a first enhancement mode MOSFET having a first drain, a first source and a first channel. The first drain is connected in series relationship to the switch input.

Also included is a second enhancement mode MOSFET having a second drain, a second source and a second channel. The second drain is connected in series relationship with the switch output.

A first and a second current-sensing resistor are connected in series relationship between the first source and the second source, there being a common point between the resistors.

A first photovoltaic source having a first terminal and a second terminal is also included. The first terminal is connected to the first and second gates and the second terminal is connected to the common point.

Also included are selectable illumination means, wherein the switch input and output are disconnected when the first photovoltaic source is not illuminated and the input and output are bi-polarly connected but current-limited when the first photovoltaic source is illuminated.

The photovoltaic source may be, for example, an array of series connected diodes and the illumination means an LED.

In addition, a first voltage-limiting means may be connected in parallel relationship with the first photovoltaic source. This first voltage-limiting means may be a zener diode.

To improve the "off" isolation of the switch, a second photovoltaic source having a third terminal and a fourth terminal may be added to the switch. The third terminal is connected to the common point. Also added is a first diode connected in series relationship between the first drain and the fourth terminal and a second diode connected in series relationship between the second drain and the fourth terminal.

The second photovoltaic source is illuminated when the first photovoltaic source is not illuminated and the second photovoltaic source is not illuminated when the first photovoltaic source is illuminated. In this way, the capacitance of the first and second MOSFETs is minimized when the switch is open.

To increase the voltage handling limit, the switches can be cascaded in series.

BRIEF DESCRIPTION OF THE DRAWING

The FIGURE is a schematic diagram of a circuit according to the invention.

DESCRIPTION OF THE PREFERRED EMBODIMENTS

Referring to the figure, a circuit 10 has an input terminal 12 that is connected to the first terminal of a fusible resistor 14 (e.g. 1,000 ohms). The other terminal of the fusible resistor 14 is connected to the first terminal of a spark gap surge arrestor 16, which becomes a short circuit when a threshold is exceeded (e.g. 1,500 volts). The other terminal of the surge arrestor 16 is connected to a common tie point 18.

The drain of an n-channel enhancement MOSFET 22 is connected to the first terminal of the surge arrestor 16. An anti-parallel diode 20 is a parasitic element of the MOSFET 22 itself, appearing between its source and drain. The source of the MOSFET 22 is connected to the first terminal of a resistor 24. The other terminal of the resistor 24 is connected to the first terminal of a resistor 26, to the anode of a zener diode 28, and to the cathode of a photovoltaic diode array 30.

The other terminal of the resistor 26 is connected to the source of an n-channel enhancement MOSFET 32. An anti-parallel diode 34 is a parasitic element of the MOSFET 32.

The cathode of the zener diode 28 and the anode of the array 30 are both connected to the gates of the MOSFETs 22, 32.

The resistors 24, 26 may be, for example, 1,000 ohms each and the zener voltage of the zener diode may be, for example, 6.2 volts.

The array 30 is optically coupled to an LED 36.

The drain of the MOSFET 32 is also connected to the anode of a diode 38 and to the drain of an n-channel enhancement MOSFET 42. An anti-parallel diode 44 is a parasitic element the MOSFET 42. The source of the MOSFET 42 is connected to the first terminal of a resistor 46. The other terminal of the resistor 46 is connected to the first terminal of a resistor 48, to the anode of a zener diode 50 and to the cathodes of a pair of photovoltaic arrays, 52, 54.

The other terminal of the resistor 48 is connected to the source of an n-channel enhancement MOSFET 56. An anti-parallel diode 58 is a parasitic element of the MOSFET 56. The drain of the MOSFET 56 is connected to the cathode of a diode 60.

The cathode of the zener diode 50 and the anode of the array 54 are both connected to the gates of the MOSFETs 42, 56. The anode of the array 52 is connected to the anodes of the diodes 38, 60.

The resistors 46, 48 may be, for example, 1,000 ohms each and the zener voltage of the zener diode 50 may be, for example, 6.2 volts.

The array 52 is optically coupled to an LED 62 and the array 54 is optically coupled to an LED 64.

The drain of the MOSFET 56 is also connected to one juncture of a pair of diodes 66, 68 connected in opposite polarity parallel relationship and to the input of a switch 70 (e.g. an n-channel JFET). The output of the switch 70 is connected to the noninverting input of an op-amp 72.

The output of the op-amp 72 is connected to an output terminal 74, to the first terminal of a resistor 76 and to the inverting input of the op-amp 72. The other terminal of the resistor 76 is connected to the other juncture of the diodes 66, 68 and to one end of a pair of zener diodes 78, 80 connected in opposing serial relationship. The other end of the pair of zener diodes 78, 80 is through a resistor 82 to the common tie point 18.

The resistor 76 may be, for example, 1,000 ohms and the zener voltage of the pair of zener diodes 78, 80 may be, for example, 22 volts.

The output terminal 74 is also connected to the anode of the LED 36, to one side of the switch 84 and to the cathodes of the LEDs 62, 64. The other side of the switch 84 is connected to the cathode of the LED 36 and to the anode of a current regulator diode 86. The anode of the regulator diode is connected to a negative voltage source $-V$.

The anode of the LED 62 is connected to one output of a switch 88. The other output of the switch 88 is connected to the anode of the LED 64. The input of the switch 88 is connected to the cathode of a current regulator diode 90. The anode of the regulator diode 90 is connected to a positive voltage source $+V$.

The array 30 and the LED 36, the array 52 and the LED 62, and the array 54 and the LED 64 may be advantageously embodied in the form of integrated packages containing one or more array/LED pairs. Because the LEDs 36, 62, 64 are driven by the output of the op-amp 72, isolation resistance and capacitance are guarded out.

When the LED 36 is energized by opening the switch 84, the array 30 is illuminated and provides a light-generated voltage (e.g. 10 volts open-circuit), which is clamped to the zener voltage of the zener diode 28. This voltage then appears between the source and gate of the MOSFET 22 via the resistor 24 and, similarly, between the source and gate of the MOSFET 32 via the resistor 26.

This then allows a positive signal applied to the input terminal 12 to flow through the fusible resistor 14, to pass from the drain to the source of the MOSFET 22, through the resistors 24, 26 and through the MOSFET 32 (diode 34) to the drain of the MOSFET 32.

Conversely, a negative signal applied to the input terminal 12 flows through the fusible resistor 14, through the MOSFET 22 (diode 20), through the resistors 24, 26 and passes from the source to the drain of the MOSFET 32. This effectively connects the drain of the MOSFET 22 with the drain of the MOSFET 32, except as described below for currents in excess of a desired maximum.

When the LED 36 is turned off by closing the switch 84, no voltage is generated by the array 30 and the MOSFETs 22, 32 are off, preventing any signal from flowing between their respective drains and sources. This effectively disconnects the drain of the MOSFET 22 from the drain of the MOSFET 32. This disconnection or isolation can be further improved by means described below.

Similarly, when the LED 64 is energized through the switch 88, the array 54 generates a voltage that allows the MOSFETs 42, 56 to pass the signal at the drain of the MOSFET 42 to the drain of the MOSFET 56.

When the LED 64 is off, no voltage is generated by the array 54 and no signal flows from the drain of the MOSFET 42 to the drain of the MOSFET 56.

By using two stages of MOSFETs (i.e. MOSFETs 22, 32 (e.g. 900 volts maximum) and MOSFETs 42, 56 (e.g. 900 volts maximum)) a higher voltage may be switched (e.g. 1,800 volts).

The drain to gate capacitance of a MOSFET can be relatively high (e.g. >500 picofarads) if the drain to gate voltage is less than 10 volts. On the other hand, this capacitance is quite low (e.g. 40–50 picofarads) for a drain to gate voltage of 10 volts or more.

When the arrays 36, 64 are not illuminated, the LED 62 is energized through the switch 88. This illuminates the array 52, resulting in a voltage (e.g. 10 volts) being applied through the diodes 38, 60 across the respective drains and gates of the MOSFETs 42, 56. By applying this voltage across the MOSFETs 42, 56 the respective drain to gate capacitances are minimized and the isolation of the circuit 10 at high frequencies substantially improved.

Another advantage of the circuit 10 is that because the control voltages for the MOSFETs 22, 32, 42, 46 are actually produced by the arrays 30, 54 and the gate currents return to the respective array, the gate currents do not contribute to the input bias current of the op-amp 72.

When the arrays 30, 54 are illuminated and the array 52 is not illuminated, the circuit 10 is "on" and an input signal applied to the input terminal 12 appears at the drain of the MOSFET 56, where it is applied to the noninverting input of the op-amp 72 through the switch 70. The op-amp 72 then provides a buffered version of the input signal at the output terminal 74. In normal operation (not overloaded), the voltage at the drain of the MOSFET 56 is less than that of the zener voltages of the zener diodes 78, 80 and little or no current flows into the input terminal 12.

When the arrays 30, 54 are not illuminated and the array 52 is illuminated, the circuit 10 is "off" and a signal applied to the input terminal 14 is blocked from the op-amp 72.

The circuit 10 provides a solid-state switch that has an resistance for Johnson noise purposes equal to the sum of the resistors 14, 24, 26, 46, 48 (e.g. 5,000 ohms) when "on" (and not current-limited) and an isolation on the order of $10^{10}$ when "off." The Johnson noise associated with the input resistance of the present invention can be quite low (e.g. 60 nanovolts peak-to-peak for a 0.1–10 Hz bandwidth).

To provide additional isolation in the "off" state the switch 70 is also opened. This eliminates leakage current at the noninverting input of the op-amp 72 that may otherwise flow through the diodes 66, 68 to the output of the op-amp 72. Without the switch 70, this leakage current would be on the order of the voltage at the input terminal 12 divided by $10^{10}$ ohms.

It should be noted that in normal operation, the inverting and non-inverting input of the op-amp 72 are at equal potential and thus the diodes 66, 68 have zero volts across them and the leakage current for the zener diodes 78, 80 is supplied through the resistor 76.

In the prior art, a large input resistor (e.g. 200 Kohms) is provided for protection to limit current into the device (with a resulting large Johnson noise). In the circuit 10, the input resistance is much lower (e.g. 5,000 ohms). However, protection from large currents is still provided.

For protection from very large overloads, the surge arrestor 16 and fusible resistor 14 are provided. Before a voltage applied to the input terminal 12 exceeds the limits of the MOSFETs 22, 32, 42, 56, the surge arrestor 16 shorts and opens the fusible resistor 14, thereby protecting the remaining circuitry.

For less serious overloads, if a positive voltage is applied to the input terminal 12 that is greater than the sum of the diode drops of the diode 66 and the zener diode 80 and the zener voltage of the zener diode 78 or if a negative voltage is applied to the input terminal 12 that is greater than the sum of the diode drops of the diode 68 and the zener diode 78 and the zener voltage of the zener diode 80, the zener diode 78 or the zener diode 80, respectively, clamp the voltage at the drain of the MOSFET 56 to the respective sums.

This clamping protects the op-amp 72 from excessive voltages. Plus, if the clamping voltage is chosen to be within the active range of the op-amp 72, not only is the op-amp 72 protected, it remains in its active range allowing faster recovery from the overload. However, without the advantages of the invention, excessive currents could still flow through the portion of the circuit 10 ahead of the op-amp 72.

If a positive input voltage is applied to the input terminal 12 that is greater than the sum of the diode drops of the diode 66 and the zener diode 80 and the zener voltage of the zener diode 78, current flows immediately through the diode 66, the zener diode 78 and the zener diode 80. At high frequencies, the initial magnitude of this current is the input voltage at the input terminal 12 over the resistance of the resistor 14. This current flows "around" the MOSFETs 22, 42 through device capacitances.

As current flows through the MOSFETs 22, 42, it results in a voltage across the resistors 24, 46 that "bucks" the gate drive from the arrays 30, 54. When this bucking voltage becomes high enough, the MOSFETs 22, 42 begin to shut off, thus current-limiting the circuit 10. The resistors 24, 46 thus act as current-sensing resistors. In particular, the input current to the input terminal 12 is limited to less than the difference between the zener voltage of zener diode 28 (or the zener diode 50) less the gate-to-source threshold voltage of the MOSFET 22 (or the MOSFET 42) all divided by the resistance of the resistor 24 (or the resistor 46).

The value of the current limit can be chosen low enough to avoid device heating during overload conditions, while still allowing the use of relatively low resistance resistors 24, 46.

Similarly if a negative voltage is applied to the input terminal 12 a "bucking" voltage is developed across the resistors 26, 48 that limits the current through the MOSFETs 32, 56.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A current-limiting solid-state switch operable to connect an input to an output comprising:
    a first enhancement mode MOSFET having a first drain, a first source and a first channel, said first drain being connected in series relationship with said input;
    a second enhancement mode MOSFET having a second drain, a second source and a second channel, said second drain being connected in series relationship with said output;
    a first and a second current-sensing resistor, said resistors being connected in series relationship between said first source and said second source, there being a common point between said resistors;
    a first photovoltaic source having a first terminal and a second terminal, said first terminal being connected to said first and second gates and said second terminal being connected to said common point; and
    selectable illumination means, wherein said input and output are disconnected when said first photovoltaic source is not illuminated and said input and output being bi-polarly connected but current-limited when said first photovoltaic source is illuminated.

2. A switch according to claim 1, wherein said first photovoltaic source comprises a plurality of series connected diodes and said illumination means comprises at least one LED.

3. A switch according to claim 1, further comprising a first voltage-limiting means connected in parallel relationship with said first photovoltaic source.

4. A switch according to claim 3, wherein said first voltage-limiting means comprises a zener diode.

5. A switch according to claim 1, further comprising:
    a second photovoltaic source having a third terminal and a fourth terminal, said third terminal being connected to said common point;
    a first diode connected in series relationship between said first drain and said fourth terminal; and
    a second diode connected in series relationship between said second drain and said fourth terminal, said second photovoltaic source being illuminated when said first photovoltaic source is not illuminated and said second photovoltaic source being not illuminated when said first photovoltaic source is illuminated, whereby the capacitance of said first and second MOSFETs is minimized when said input and output are disconnected.

6. A high voltage, current-limiting, solid-state switch comprising a plurality of switches according to claim 1 connected in series relationship, said high-voltage, current-limiting, solid-state switch having a higher voltage limit than any one of said plurality of switches.

* * * * *